United States Patent [19]

Bientz

[11] Patent Number: 5,340,640
[45] Date of Patent: Aug. 23, 1994

[54] CONDUCTIVE INK FOR USE WITH PRINTED CIRCUIT MODULES

[75] Inventor: Alfred Bientz, Chateau-Gontier, France

[73] Assignee: Molex Incorporated, Lisle, Ill.

[21] Appl. No.: 36,309

[22] Filed: Mar. 24, 1993

[30] Foreign Application Priority Data

Mar. 25, 1992 [DE] Fed. Rep. of Germany ....... 4209597

[51] Int. Cl.⁵ .............................................. B32B 3/00
[52] U.S. Cl. ..................... 428/206; 174/254;
174/257; 174/260; 361/748; 361/779; 428/209;
428/210; 428/323; 428/698; 428/901
[58] Field of Search ............. 428/209, 698, 901, 323,
428/325, 210, 206; 174/254, 257, 260; 361/748,
751, 778, 779, 792; 501/87, 96; 252/516, 520

[56] References Cited

U.S. PATENT DOCUMENTS

| | | | |
|---|---|---|---|
| 3,875,434 | 4/1975 | Harden et al. | 307/308 |
| 4,696,764 | 9/1987 | Yamazaki | 252/503 |
| 4,701,279 | 10/1987 | Kawaguchi et al. | 252/511 |
| 4,844,784 | 7/1989 | Suzuki et al. | 204/180.9 |

Primary Examiner—Patrick J. Ryan
Assistant Examiner—Marie R. Macholl
Attorney, Agent, or Firm—Stacey E. Caldwell

[57] ABSTRACT

A printed circuit module, particularly for electronic applications and equipment, comprising a rigid or flexible circuit carrier substrate (1), conductive traces (2) printed on the substrate, and electronic components (5) for electrical connection thereto. The conductive traces comprise a printed ink layer having fine conductive particles embedded therein. The ink is rendered conductive by a touch-contact distribution of the particles in the printed ink layer. The conductive particles comprise electrically conductive crystallites (8) composed of a non-oxidizable crystalline compound of an element of sub-group IV of the Periodic Table, along with nitrogen or carbon. The electronic components (5) are electrically connected to the conductive traces (2) with an anisotropic adhesive (7). The adhesive may also contain the crystallites to effect an electrical connection between the conductive traces (2) and the contact areas (6) of electronic components (5).

8 Claims, 2 Drawing Sheets

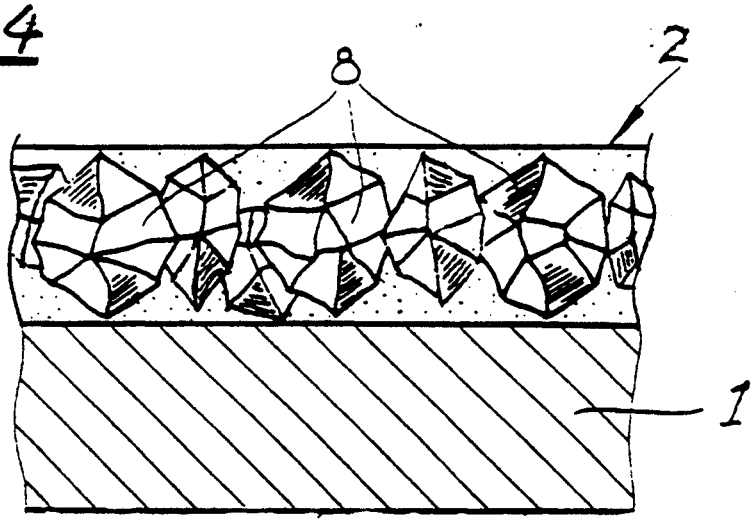
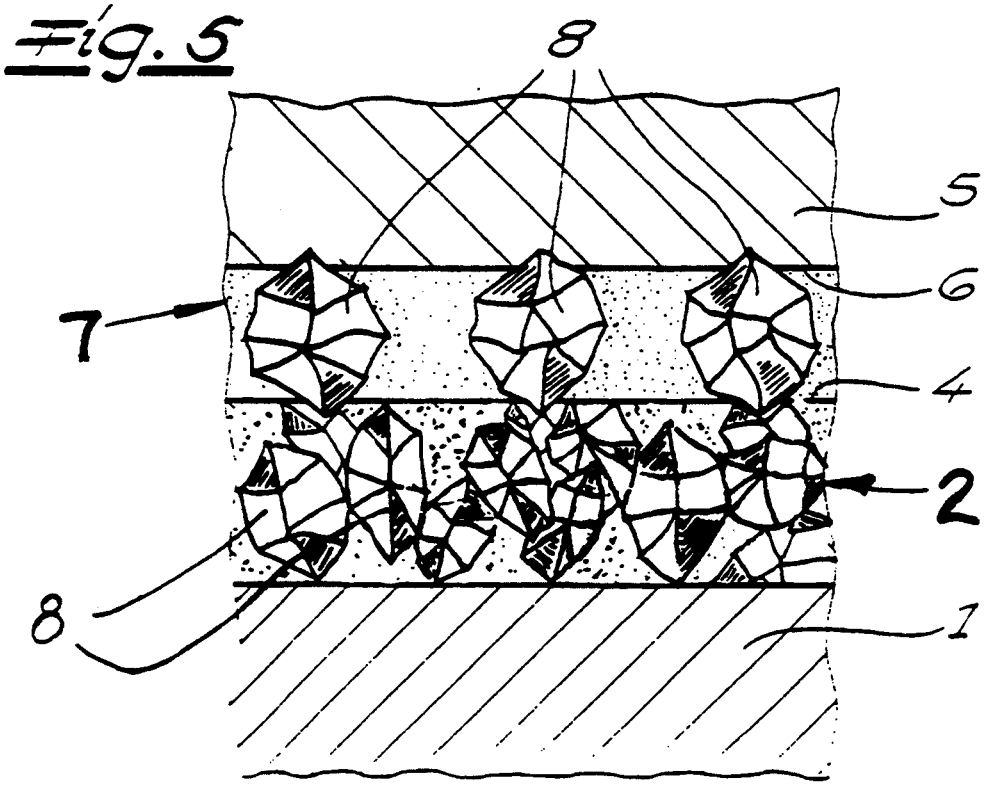

CONDUCTIVE INK FOR USE WITH PRINTED CIRCUIT MODULES

FIELD OF THE INVENTION

This invention relates to printed circuit modules, particularly for electronic applications, comprising a rigid or flexible circuit carrier substrate with conductive traces printed thereon adapted for electrically connecting to electronic components, and, in particular, to the composition of such conductive traces.

BACKGROUND OF THE INVENTION

Typically, printed circuit modules include conductive traces consisting of a layer of printed ink having fine conductive particles embedded therein. The ink is rendered conductive by physical contact between the conductive particles therewithin, and electronic components are connected to contact areas of the conductive traces to effect an electrical connection therebetween. Such printed circuit modules are used in various areas of electronic technology. The circuit modules can be interchangeable or installed permanently in electronic devices and equipment. Rigid circuit carrier substrates, for example, typically consist of an epoxy resin construction, with glass fiber or glass fiber inserts. Flexible circuit carrier substrates are, for example, films of polyester resin or the like. Electronic components include any components usual in electronics used in conjunction with printed circuits. The electronic components can perform various functions or sophisticated circuitry, and may include functional parts as well as simple junctions or connecting bridges.

In printed circuit modules known in practice, the conductive traces consist of printed ink layers which include fine metallic particles, such as silver or nickel embedded therein. However, metallic silver, though very conductive, is not very hard, and both silver and nickel are affected by and corrode under the influence of the surrounding environment. When using such materials, harmful changes in conductivity often cannot be avoided. It is therefore usually necessary to coat the conductive traces, and more particularly, the contact areas of the traces, with a protective layer of carbon, for example. However, prior to the electrical connection to a corresponding contact surface of an electronic component, the protective layer of carbon must be removed or otherwise be rendered ineffective in order that an adequate electrical connection can be made. These secondary procedures can be time-consuming and costly.

SUMMARY OF THE INVENTION

An object of the invent ion is to provide a printed circuit module having conductive traces with particles embedded therein made from non-oxidizable material wherein the conductivity of the conductive traces is not affected by the environment. Another object of the invention is to provide a simplified connection between the contact surfaces of an electronic component and the contact areas of conductive traces on a printed circuit module.

The invention is characterized in that at least the contact areas of the conductive traces consist of a printed ink layer comprising fine conductive crystallites consisting of a non-oxidizable crystalline compound of an element of sub-group IV of the Periodic Table, for example titanium, along with nitrogen or carbon. Such crystallites are intended to replace the silver or nickel in printing inks, and avoid the costly protective carbon layer for fine pitch traces and contact areas. Preferably the conductive traces in their entirety consist of such a printed ink layer, that is, the entire trace, including the contact area, may consist of the crystallite-embedded printed ink layer.

According to another aspect of the invention, making contact between the contact areas of the conductive traces and the corresponding contact surfaces of an electronic component is accomplished whereby the contact surfaces of the electronic component include a hardened adhesive layer, non-conductive along the plane of the layer, in which are embedded the non-oxidizing crystallites formed, as the crystallites in the printed ink layer, from a non-oxidizing crystalline compound of an element of sub-group IV of the Periodic Table, such as titanium, together with nitrogen or carbon. The adhesive is a known adhesive used in printed circuit modules having the fine crystallites embedded therein to effect the electrical connection between the two components. The electrical connection is made by pressing down on the electronic component and pressing the crystallites of the ink layer into physical contact with both the crystallites of the conductive traces and the corresponding contact surfaces of the electronic component. The electrical connection is made in a direction perpendicular to the adhesive layer plane, the adhesive being non-conductive in the direction along the layer plane. The adhesive layer is non-conductive in the layer plane when the number of non-oxidizing crystallites in the adhesive layer is less than 10% by weight. The crystallites used in the invention, both in the ink and the adhesive, possess relatively high hardness and are sufficiently sharp-edged to allow being pressed into the contact areas of the conductive traces and into the corresponding contact surfaces of the electronic component. If components are used whose contact surfaces include a protective layer or coating, this is not harmful in the context of the invention, since the crystallites can penetrate the protective layer or layers.

In the preferred embodiment of the invention, the crystallites consist of titanium nitride, or titanium carbide. Such crystallites possess the requisite hardness and conductivity contemplated by the invention.

Other objects, features and advantages of the invention will be apparent from the following detailed description, taken in conjunction with the accompanying drawings.

BRIEF DESCRIPTION OF THE DRAWINGS

The invention is explained in detail below by means of the following drawings in which:

FIG. 4 is the portion C in FIG. 2 on a much enlarged scale; and

FIG. 5 is the portion D in FIG. 3 on the same scale as FIG. 4.

DETAILED DESCRIPTION OF THE INVENTION

Figure 1:
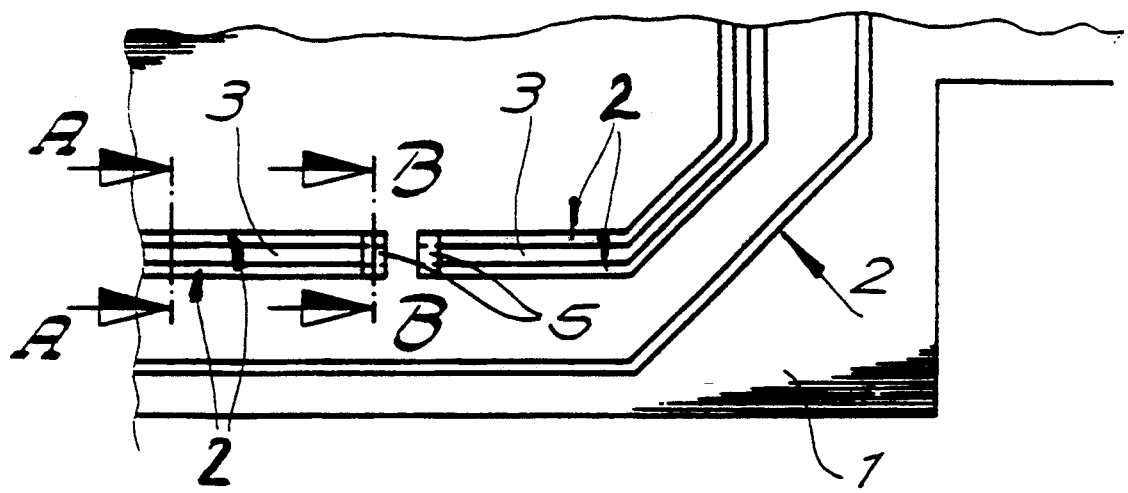
FIG. 1 is a plan view of a printed circuit module which includes a conductive ink layer printed thereon.

FIG. 1 shows a printed circuit module consisting of a flexible or rigid substrate 1. Conductive traces 2, in the form of a printed ink layer, are printed thereon. The conductive traces 2 are separated from each other by intervening non-conductive spaces 3. Electronic components are adapted to be electrically connected to the conductive traces 2. The conductive traces 2 include contact areas 4 for making an electrical connection to complementary contact surfaces of electronic component 5 or the like.

Figure 2:
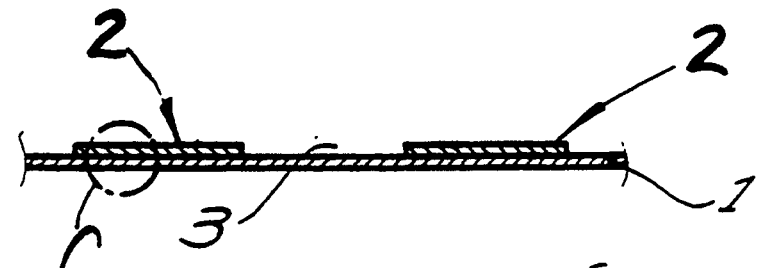
FIG. 2 is a section taken along A—A of the article in FIG. 1, on an enlarged scale.

FIG. 2 is a section of the circuit module, taken along line A—A in FIG. 1, showing two parallel printed conductive traces 2.

Figure 3:
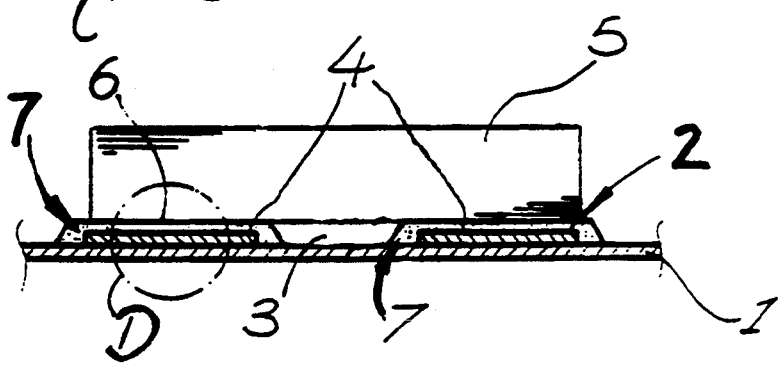
FIG. 3 is the section taken along B—B of the article in FIG. 1, on an enlarged scale.

FIG. 3 is a section of the circuit module, similar to that shown in FIG. 2, but taken along line B—B in FIG. 1, showing the contact areas 4 of the two parallel printed conductive traces 2. An adhesive layer 7 is applied over the contact areas 4 of the conductive traces 2, for example by screen printing. Component 5, which includes complementary contact surfaces 6 for electrically connecting to contact areas 4, is fixed to the circuit module with the aid of adhesive layer 7. Adhesive layer 7 itself comprises a known plastic-based adhesive used in connecting electronic components to circuit modules and printed circuits.

FIGS. 4 and 5 depict the portions C and D of FIGS. 2 and 3, respectively, on a much enlarged scale. FIG. 4 is an exaggerated depiction of the conductive trace imprinted on the circuit module. The invention contemplates that at least the contact areas 4 of the conductive traces 2 are in the form of a printed ink layer with fine conductive crystallites 8 embedded therein, the crystallites being formed of a non-oxidizable crystalline compound of an element of sub-group IV of the Periodic Table, such as titanium, along with nitrogen or carbon. The crystallites 8 are distributed in such a way that they are physically touching one another, thus rendering the printed ink layer conductive. The preferred embodiment of the invention contemplates that the entire conductive trace 2 comprise such a printed ink layer 2 having the conductive crystallites embedded therein, as shown in FIG. 2. FIG. 5 illustrates the four layers of the interface printed circuit module and electronic component, including (from the bottom as shown in FIG. 5) the printed circuit module 1, the conductive trace or printed ink layer 2, the adhesive layer 7, and the complementary contact surface of the electronic component 5. It can be seen in FIG. 5 that the same type of crystallites 8 are embedded in adhesive layer 7, i.e. formed from an electrically conductive crystalline compound of sub-group IV of the Periodic Table, together with nitrogen or carbon, as are embedded in the printed ink layer. However, in the adhesive layer 7, the crystallites are distributed so as not to exhibit any physical contact therebetween, and therefore the adhesive is non-conductive in the direction parallel to its layer plane. It can be seen that, after applying the compact adhesive layer 7, component 5 is pressed onto the adhesive layer 7, whereby crystallites 8 are pressed into the crystallites of contact areas 4 of conductive traces 2 and complementary contact surfaces 6 of electronic component 5, thereby effecting an electrical connection perpendicular to the adhesive layer plane between the conductive traces 2 of the substrate and the electronic component contact surfaces 6. Therefore, the non-conductive intervening space 3 between the conductive traces 2 in FIG. 2 may also be provided with such adhesive layer 7 by screen printing, since, by virtue of the fact that the adhesive is only conductive in a direction perpendicular to the layer, there will be no conductivity in the area of the intervening spaces. The adhesive layer is non-conductive in the layer plane when the number of non-oxidizing crystallites in the adhesive layer is less than 10% by weight.

It can also be suitable to proceed in the manner described if the contact area 4 or complementary contact surfaces 6 display a protective cover film, or oxide layer, as the crystallites penetrate through such layers.

As shown in FIG. 5, the preferred embodiment of the invention contemplates that the thickness of adhesive layer 7 be only slightly more than the thickness of a single crystallite 8. It is also shown in FIG. 5 that crystallites 8 are distributed throughout the printed ink layer such that they are making contact with one another, however the crystallites are distributed throughout the adhesive layer in such a way as to exhibit little or no contact with one another so that the adhesive layer possesses no conductivity along the layer plane.

Furthermore, the crystallites 8 of printed ink layer 2 and adhesive layer display relatively equal grain size within a very narrow range. In the preferred embodiment, crystallites 8 consist of titanium nitride or titanium carbide.

We claim:

1. In a printed circuit module for electronic applications, said printed circuit module including a circuit substrate (1) having conductive traces (2) in the form of an ink layer printed thereon, the improvement in the conductive traces comprising:

conductive crystallites (8) embedded in the ink layer, said conductive crystallites formed from a non-oxidizable crystalline compound of an element of sub-group IV of the Periodic Table, and one of the elements of the group consisting of nitrogen and carbon, wherein the conductive crystallites are distributed within the ink layer such that each of the crystallites is in contact with an adjacent crystallite.

2. In a printed circuit module as set forth in claim 1 wherein the conductive traces include contact areas (4) adapted to make an electrical connection with corresponding contact surfaces (6) of an electronic component (5), and wherein the conductive crystallites (8) are embedded within the ink layer at the contact areas.

3. In a printed circuit module as set forth in claim 2, wherein the contact surfaces (6) of the electronic component (5) include an adhesive layer (7) having the conductive crystallites (8) embedded therein and distributed such that there is no physical contact between the crystallites, whereby upon pressing down on the electronic component (5), the crystallites (8) of the adhesive layer (7) are pressed into contact with the crystallites (8) of the ink layer and the complementary contact surfaces (6) of the electronic component (5) to effect an electrical connection therebetween, perpendicular to the adhesive layer plane.

4. In a printed circuit module as set forth in claim 3, wherein the content of the crystallites (8) in the adhesive layer (7) is approximately 10% by weight.

5. In a printed circuit module as set forth in claim 3, wherein the thickness of the adhesive layer (7) is substantially equal to the thickness of a single crystallite (8).

6. In a printed circuit module as set forth in claim 1, wherein the crystallites consist of titanium nitride.

7. In a printed circuit module as set forth in claim 1, wherein the crystallites consist of titanium carbide.

8. In a printed circuit module as set forth in claim 1, wherein each of the crystallites (8) are of substantially equal size.

* * * * *